United States Patent
Ochi et al.

(10) Patent No.: US 7,236,063 B2
(45) Date of Patent: Jun. 26, 2007

(54) BROADBAND MODULATION PLL, AND MODULATION FACTOR ADJUSTMENT METHOD THEREOF

(75) Inventors: Taketoshi Ochi, Yokosuka (JP); Shunsuke Hirano, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 90 days.

(21) Appl. No.: 10/539,426

(22) PCT Filed: Jul. 22, 2004

(86) PCT No.: PCT/JP2004/010776

§ 371 (c)(1),
(2), (4) Date: Jun. 20, 2005

(87) PCT Pub. No.: WO2005/020429

PCT Pub. Date: Mar. 3, 2005

(65) Prior Publication Data
US 2006/0055467 A1    Mar. 16, 2006

(30) Foreign Application Priority Data
Aug. 22, 2003   (JP)   ............. 2003-298858

(51) Int. Cl.
*H03B 5/00*   (2006.01)
(52) U.S. Cl. ............... 331/183; 331/182; 331/175; 331/177 R; 332/127; 332/128

(58) Field of Classification Search ........ 331/175, 331/182, 183, 177 R; 332/127, 128
See application file for complete search history.

(56) References Cited

U.S. PATENT DOCUMENTS

| 6,211,747 B1 | 4/2001 | Trichet et al. ......... 332/128 |
| 2003/0052744 A1 | 3/2003 | Suto |

FOREIGN PATENT DOCUMENTS

| JP | 1-171114 | 12/1989 |
| JP | 11-68719 | 3/1999 |
| JP | 2003-92513 | 3/2003 |

*Primary Examiner*—Arnold Kinkead
(74) *Attorney, Agent, or Firm*—Pearne & Gordon LLP

(57) ABSTRACT

A problem of the present invention is to provide a wide band modulation PLL having good modulation accuracy at low cost. With respect to a PLL having a VCO (21), a frequency divider (22), a phase comparator (23), a charge pump (24) and a loop filter (25), the VCO (21) and a frequency dividing ratio of the frequency divider (22) are controlled to perform modulation. The VCO (21) has two control terminals for PLL and modulation, and a control signal generation part (28) generates a control voltage $V_{tm}$ of the VCO (21) based on phase modulation data and an input voltage $V_{tl}$ to the control terminal for PLL. At the time of adjusting a modulation factor, the control voltage $V_{tm}$ to the control terminal for modulation of the VCO (21) is controlled and also the input voltage $V_{tl}$ is measured and a modulation sensitivity of a frequency of the VCO (21) to $V_{tm}$ is calculated and a modulation factor of the phase modulation data is adjusted based on the modulation sensitivity obtained.

10 Claims, 15 Drawing Sheets

BROADBAND MODULATION PLL, AND MODULATION FACTOR ADJUSTMENT METHOD THEREOF

TECHNICAL FIELD

The present invention relates to a wide band modulation PLL capable of generating and outputting an RF (Radio Frequency) modulation signal modulated by a modulation signal having a bandwidth wider than a bandwidth of a PLL, and a modulation factor adjustment method thereof.

BACKGROUND ART

Generally, a PLL (Phase Locked Loop) modulation circuit requires low cost, low power consumption, good noise characteristics, and modulation accuracy. When modulation is performed in the PLL, it is desirable to widen a frequency bandwidth of the PLL (PLL band) than a frequency bandwidth of a modulation signal (modulation band) in order to improve the modulation accuracy.

However, widening the PLL bandwidth causes degradation in the noise characteristics. Thus, a technique of two-point modulation in which a PLL bandwidth is set at a value narrower than a modulation bandwidth and modulation within a PLL band and modulation without the PLL band are performed at two different points has been devised (for example, see Patent Reference 1).

FIG. 10 is a schematic configuration diagram showing a conventional wide band modulation PLL. As shown in FIG. 10, the conventional wide band modulation PLL includes a PLL having a voltage controlled oscillator (hereinafter VCO) 1 in which an oscillation frequency changes according to a voltage of a control voltage terminal (Vt), a frequency divider 2 for dividing a frequency of an RF modulation signal outputted from the VCO 1, a phase comparator 3 for comparing phases of a reference signal and an output signal of the frequency divider 2 and outputting a signal according to a phase difference and a loop filter 4 for averaging an output signal of the phase comparator, a modulation sensitivity table 7 for outputting a modulation signal based on modulation data, a D/A converter 10 for converting an output signal of the modulation sensitivity table 7 into an analog voltage while adjusting a gain according to a gain control signal from a control part 6, a delta and sigma modulator 9 in which delta and sigma modulation of a signal obtained by adding channel selection information to the output signal from the modulation sensitivity table 7 is performed and the signal is outputted to the frequency divider 2 as a frequency dividing ratio, and an A/D converter 11 for converting a voltage value of Vt into a digital value and outputting the value to the control part 6.

FIG. 11 is a diagram showing a frequency characteristic for description of an action of a wide band modulation PLL. Here, a transfer function of the PLL is set at H(s) (where s=jω). H(s) has a low-pass characteristic as shown in FIG. 11. A low-pass filter of a transfer function H(s) is applied to a modulation signal added to a frequency dividing ratio set in the frequency divider 2. On the other hand, a high-pass filter of a transfer function 1-H(s) as shown in FIG. 11 is applied to a modulation signal added to the control voltage terminal (Vt) of the VCO 1.

Since these two modulation components are added in the control voltage terminal of the VCO 1, the modulation signal is multiplied by a characteristic shown by a broken line of FIG. 11 equivalently, that is, 1 and is given to the VCO 1.

As a result of that, an RF modulation signal with a wide band ranging to the outside of a PLL band can be outputted from the VCO 1.

By the way, amplitude of a modulation signal inputted to the control voltage terminal of the VCO 1 is converted into a frequency shift of an RF modulation signal outputted from the VCO 1. The conversion gain is called a modulation sensitivity and generally, a unit of the modulation sensitivity is [Hz/V].

Amplitude of a signal outputted from the D/A converter 10 must match with the modulation sensitivity of the VCO 1. That is because when these matching is not achieved, the transfer function 1-H(s) is multiplied by the amount of deviation (where a times) and a characteristic combined with H(s) shown by a broken line is not flat with respect to the frequency as shown in FIG. 12. This becomes a factor in degrading modulation accuracy.

FIG. 13 is a diagram showing one example of a characteristic representing a change in an output signal frequency versus a control voltage of a general VCO. A modulation sensitivity is represented by a slope of a curve of this characteristic of frequency versus voltage. As shown in FIG. 13, the modulation sensitivity varies depending on an oscillation frequency of the VCO, so that it is necessary to change amplitude of a modulation signal inputted to the control voltage terminal of the VCO according to the oscillation frequency of the VCO in order to obtain the same frequency shift modulation signal at a different oscillation frequency of the VCO.

FIG. 14 is a diagram showing a characteristic of a modulation sensitivity versus an oscillation frequency of a general VCO. It is apparent from the same diagram that the modulation sensitivity changes depending on the oscillation frequency.

Here, one example of the case that it is necessary to change a control voltage resulting from the fact that the modulation sensitivity varies depending on the oscillation frequency of the VCO will be described. It is assumed that a modulation sensitivity at a frequency of 2 GHz of the VCO 1 is 100 MHz/V and the maximum frequency shift of a modulation signal is 5 MHz. In this case, it is necessary to input a signal with the maximum amplitude of 50 mV to Vt. However, it is assumed that a modulation sensitivity becomes 80 MHz/V at the time when a frequency of the VCO 1 is 2.1 GHz. In this case, it is necessary to input a signal with the maximum amplitude of 62.5 mV to Vt. That is, the need to change amplitude of an output signal of the D/A converter 10 by the frequency of the VCO 1 arises.

Incidentally, a modulation sensitivity for a modulation component included in a frequency dividing ratio set in the frequency divider 2 becomes a frequency of a reference signal and does not change with respect to the frequency of the VCO 1. For example, description will be made using the case of assuming that a frequency of the VCO 1 is 2 GHz and a frequency of a reference signal is 1 MHz and the maximum frequency shift of a modulation signal is 5 MHz as an example. In this case, a change range of the maximum frequency dividing ratio becomes 5. Therefore, in this calculation, the frequency of the VCO 1 is irrelevant.

In the case of FIG. 10, by having a characteristic of a modulation sensitivity versus a frequency as the modulation sensitivity table 7 and calculating the amount of variation of a control voltage at the time when a channel frequency changes, the modulation sensitivity is corrected and a gain of the D/A converter is adjusted.

Here, FIG. 15 is one example of a principle diagram of a VCO. The VCO 1 is constructed of an inductor L, a capacitor C, a variable capacitance diode $C_v$ in which capacitance varies depending on a voltage value of a control voltage Vt and an active element 100, and an oscillation frequency $f_{VCO}$ is determined by a mathematical formula 1.

$$f_{VCO} = \frac{1}{2\pi\sqrt{L(C+C_v)}} \quad \text{(Mathematical formula 1)}$$

When such a VCO is integrated into an LSI, values of elements such as the inductor L, the capacitor C and the variable capacitance diode $C_v$ vary depending on manufacturing variations. Because of this, characteristics of a modulation sensitivity versus an oscillation frequency of the VCO vary in the respective LSIs.

However, in the conventional wide band modulation PLL, it is necessary to prepare modulation sensitivity tables for characteristics of modulation sensitivities every LSI resulting from variations in the values of these elements. That is, it is necessary to separately measure the tables of the modulation sensitivity versus the frequency every LSI and write and hold the tables into memory etc.

In order to prepare the modulation sensitivity tables, it is necessary to measure the modulation sensitivities versus the frequencies of all the channels used and as a result of that, frequency switching of the PLL is performed by the number of measurement points. Therefore, there were circumstances in which a lot of time is taken and manufacturing cost is increased and also the amount of memory is large and cost of the LSI is also increased.

Further, a modulation sensitivity is corrected when a channel frequency is switched, but there were also circumstances in which variations in the modulation sensitivity because of subsequent environmental variations cannot be corrected and it is difficult to well maintain modulation accuracy.

(Patent Reference 1) U.S. Pat. No. 6,211,747

DISCLOSURE OF THE INVENTION

The present invention is implemented to solve the conventional problems, and an object of the invention is to provide a wide band modulation PLL having good modulation accuracy at low cost.

A wide band modulation PLL of the present invention comprises a PLL part including a voltage controlled oscillator, a frequency divider for dividing a frequency of an output signal of the voltage controlled oscillator, a phase comparator for outputting a signal according to a phase difference between a reference signal and an output signal of the frequency divider, and a loop filter for averaging an output of the phase comparator and outputting the output to the voltage controlled oscillator, a first modulation input part for inputting and modulating a first modulation signal to the voltage controlled oscillator based on modulation data inputted, and a second modulation input part for inputting a second modulation signal to a position different from the voltage controlled oscillator of the PLL part based on the modulation data, and the voltage controlled oscillator has a first control terminal to which the first modulation signal is inputted and a second control terminal to which a signal based on the second modulation signal is inputted, and the first modulation input part has a modulation sensitivity calculation unit for calculating a first modulation sensitivity in the first control terminal and a modulation factor adjustment unit for adjusting a modulation factor of the modulation data based on the first modulation sensitivity calculated and outputting the first modulation signal.

By this configuration, the need for a lookup table every each channel is eliminated, so that a wide band modulation PLL system having good modulation accuracy can be provided at low cost.

Also, in a wide band modulation PLL of the present invention, the modulation sensitivity calculation unit has a modulation sensitivity calculation part for measuring a signal inputted to the second control terminal and calculating a second modulation sensitivity in the second control terminal and also measuring a value indicating a ratio between the second modulation sensitivity and the first modulation sensitivity and calculating the first modulation sensitivity based on the second modulation sensitivity calculated.

By this configuration, the need for a lookup table every each channel is eliminated, so that a wide band modulation PLL system having good modulation accuracy can be provided at low cost.

Further, in a wide band modulation PLL of the present invention, the first modulation input part has an A/D converter for making digital conversion of a signal inputted to the second control terminal of the voltage controlled oscillator, the modulation sensitivity calculation unit, the modulation factor adjustment unit, and a D/A converter for making analog conversion of an output of the modulation factor adjustment unit and outputting the output to the first control terminal.

By this configuration, the need for a lookup table every each channel is eliminated, so that a wide band modulation PLL system having good modulation accuracy can be provided at low cost.

Also, in the present invention, the first modulation input part comprises an A/D converter for making digital conversion of a signal inputted to the second control terminal of the voltage controlled oscillator, the modulation sensitivity calculation unit and the modulation factor adjustment unit, and the modulation factor adjustment unit outputs a digital signal to the first control terminal, and the voltage controlled oscillator changes a frequency according to the digital signal inputted to the first control terminal.

By this configuration, a wide band modulation PLL system with small size, low cost and low power consumption can be provided.

Further, in a wide band modulation PLL of the present invention, the second modulation input part has a frequency dividing ratio generation unit for controlling a frequency dividing ratio of the frequency divider based on carrier frequency data and the modulation data.

By this configuration, the need for a lookup table every each channel is eliminated, so that a wide band modulation PLL system having good modulation accuracy can be provided at low cost.

Also, in a wide band modulation PLL of the present invention, the second modulation input part has a direct digital synthesizer for generating a modulation signal based on carrier frequency data and the modulation data and outputting the signal to the phase comparator.

By this configuration, a wide band modulation PLL system with small size, low cost and low power consumption can be provided.

Further, in a wide band modulation PLL of the present invention, the first modulation input part calculates the first modulation sensitivity and adjusting a modulation factor and outputs the first modulation signal at the time of starting the wide band modulation PLL and every predetermined period after the start.

By this configuration, modulation accuracy which is always good and stable with respect to environmental variations caused by temperature variations or power source voltage variations, etc. can be provided.

Also, the present invention provides a wireless terminal apparatus comprising the wide band modulation PLL.

By this configuration, good modulation accuracy can be provided at low cost.

A modulation factor adjustment method of a wide band modulation PLL of the present invention is a modulation factor adjustment method of a wide band modulation PLL comprising a PLL part including a voltage controlled oscillator, a frequency divider for dividing a frequency of an output signal of the voltage controlled oscillator, a phase comparator for outputting a signal according to a phase difference between a reference signal and an output signal of the frequency divider, and a loop filter for averaging an output of the phase comparator and outputting the output to the voltage controlled oscillator, and the method comprises the steps of inputting and modulating a first modulation signal to a first control terminal of the voltage controlled oscillator, inputting carrier frequency data and inputting a second modulation signal to a position different from the voltage controlled oscillator of the PLL part based on the PLL, calculating a first modulation sensitivity in the first control terminal of the voltage controlled oscillator, and adjusting a modulation factor of the first modulation signal based on the first modulation sensitivity calculated.

By this method, the need for a lookup table every each channel is eliminated in adjusting a modulation factor, so that a wide band modulation PLL system having good modulation accuracy can be provided at low cost.

Also, in a modulation factor adjustment method of the present invention, the step of calculating the first modulation sensitivity comprises the steps of measuring an input voltage inputted to a second control terminal different from the first control terminal of the voltage controlled oscillator based on the second modulation signal, calculating a second modulation sensitivity in the second control terminal, and measuring a value indicating a ratio between the second modulation sensitivity and the first modulation sensitivity and calculating the first modulation sensitivity based on the second modulation sensitivity calculated.

By this method, the need for a lookup table every each channel is eliminated in adjusting a modulation factor, so that a wide band modulation PLL system having good modulation accuracy can be provided at low cost.

According to the present invention, a wide band modulation PLL having good modulation accuracy can be provided at low cost.

Figure 1:
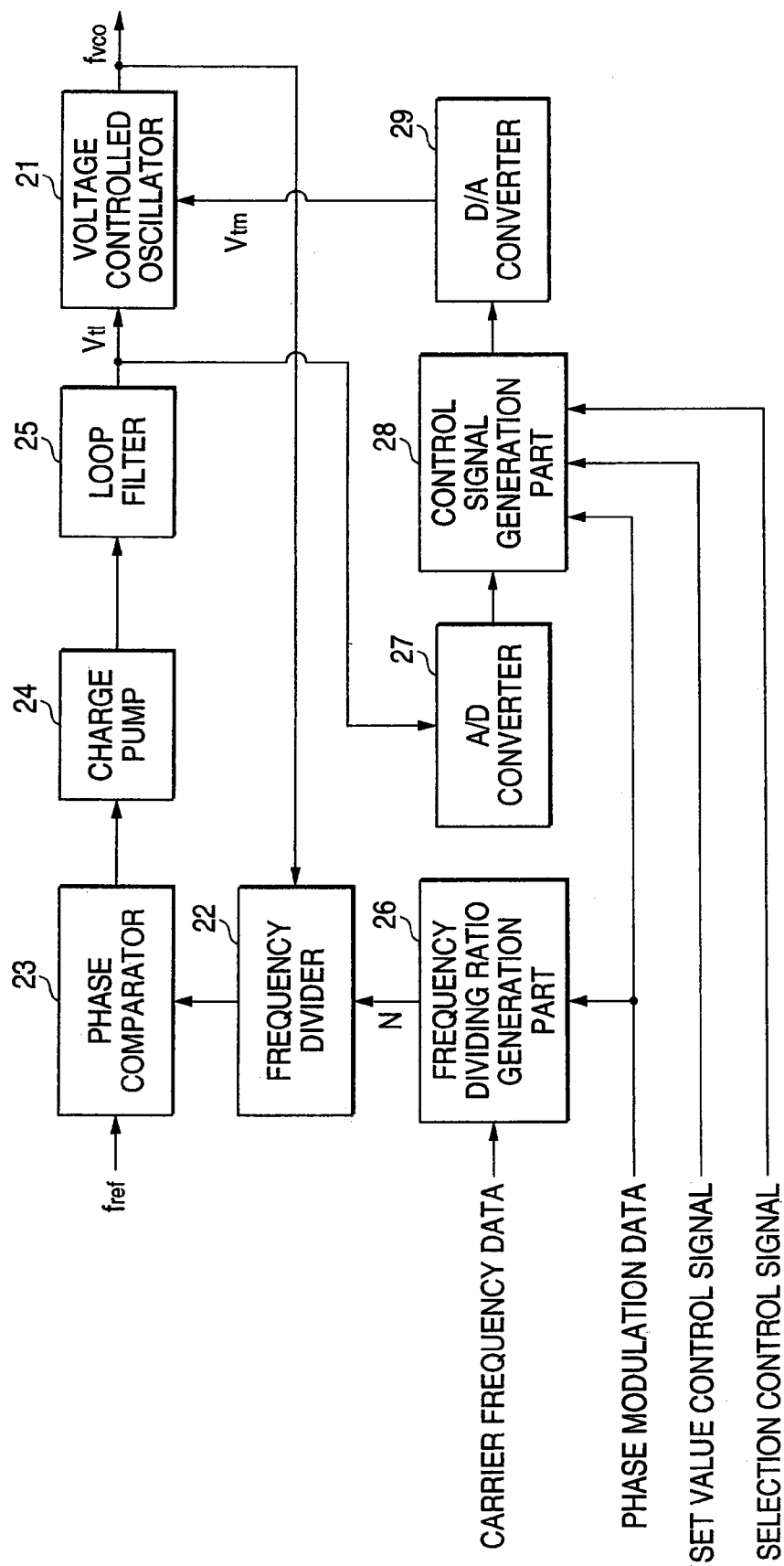
FIG. 1 is a schematic configuration diagram showing a wide band modulation PLL for describing a first embodiment of the present invention.

Incidentally, numerals 21 and 50 in the drawings denote voltage controlled oscillators, and numeral 22 denotes a frequency divider, and numeral 23 denotes a phase comparator, and numeral 24 denotes a charge pump, and numeral 25 denotes a loop filter, and numeral 26 denotes a frequency dividing ratio generation part, and numeral 27 denotes an A/D converter, and numeral 28 denotes a control signal generation part, and numeral 29 denotes a D/A converter, and numeral 30 denotes a measurement result storage part, and numeral 31 denotes an operation part, and numeral 32 denotes an operation result storage part, and numeral 33 denotes a modulation factor adjustment unit, and numeral 34 denotes a calibration data generation part, and numeral 35 denotes an output signal control part, and numeral 40 denotes a DDS.

BEST MODE FOR CARRYING OUT THE INVENTION

FIRST EMBODIMENT

FIG. 1 is a schematic configuration diagram showing a wide band modulation PLL for describing a first embodiment of the present invention. In FIG. 1, a wide band modulation PLL according to the first embodiment comprises a PLL having a voltage controlled oscillator (hereinafter VCO) 21 with two control voltage terminals for PLL (input voltage $V_{tl}$) and modulation signal input (input voltage $V_{tm}$), a frequency divider 22 for dividing a frequency of an output signal of the VCO 21, a phase comparator 23 for comparing a phase of a reference signal with a phase of an output signal of the frequency divider 22 and outputting a signal according to a phase difference, a charge pump 24 for converting an output signal of the phase comparator 23 into a control signal of the VCO 21 and a loop filter 25 for smoothing an output signal of the charge pump 24 and outputting a control voltage $V_{tl}$ to the control voltage terminal for PLL of the VCO 21.

Further, the wide band modulation PLL according to the first embodiment comprises a frequency dividing ratio generation part 26 for generating a frequency dividing ratio set in the frequency divider 22 from phase modulation data and carrier frequency data inputted from the outside, an A/D converter 27 connected to the loop filter 25, a control signal generation part 28 for adjusting a modulation factor of modulation data while generating a control signal to the VCO 21 based on the phase modulation data and an output signal of the A/D converter 27, and a D/A converter 29 for making D/A conversion of the adjusted modulation data and outputting a control voltage Vtm to the control voltage terminal for modulation signal of the VCO 21 as an analog signal.

Figure 2:
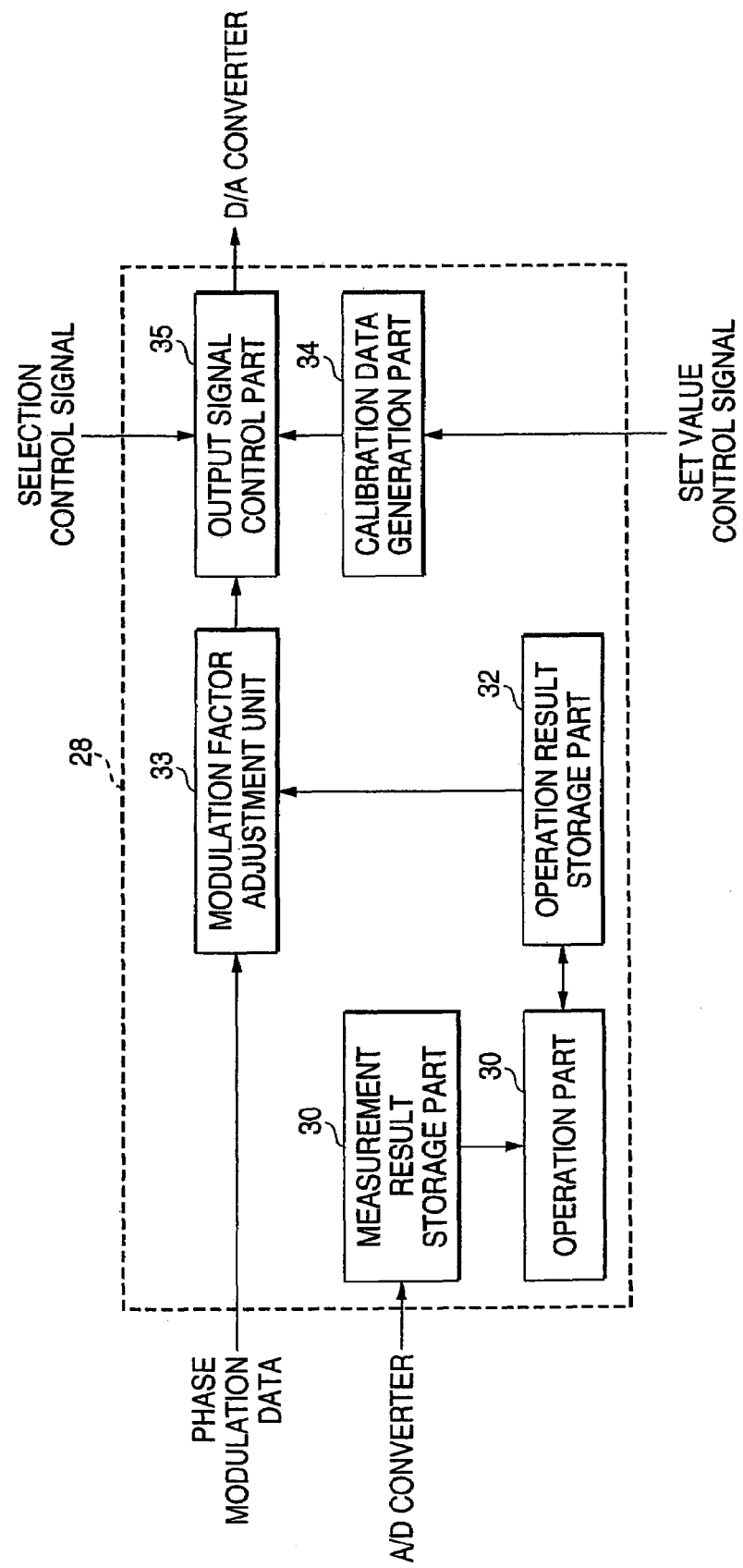
FIG. 2 is a schematic configuration diagram showing a control signal generation part of the wide band modulation PLL according to the first embodiment.

Next, the control signal generation part 28 will be described using FIG. 2. FIG. 2 is a schematic configuration diagram showing the control signal generation part of the wide band modulation PLL according to the first embodiment. The control signal generation part 28 comprises a measurement result storage part 30 for storing an output of the A/D converter 27, an operation part 31 for computing and processing a value stored in the measurement result storage part 30, an operation result storage part 32 for storing a result computed and processed in the operation part 31, a modulation factor adjustment unit 33 for adjusting a modulation factor of phase modulation data based on an operation result stored in the operation result storage part 32, a calibration data generation part 34 for setting a control voltage $V_{tm}$ inputted to the control voltage terminal for modulation signal of the VCO 21 at the time of measuring a modulation sensitivity based on a set value control signal, and an output signal control part 35 for selecting any one of calibration data outputted by the calibration data generation part 34 and modulation data outputted by the modulation factor adjustment unit 33 based on a selection control signal and outputting the data to the D/A converter 29. Here, the output signal control part 35 selects an output of the modulation factor adjustment unit at the time of a normal modulation operation, and selects an output of the calibration data generation part 34 at the time of measuring a modulation sensitivity.

Here, the carrier frequency data, the phase modulation data, the set value control signal, and the selection control signal are outputted from a control part (not shown). Incidentally, these control signals and data may be outputted by individual control parts or may be outputted by one control part for controlling the wide band modulation PLL. Further, when such a wide band modulation PLL is applied to a wireless communication apparatus such as a wireless base station or a mobile terminal apparatus, these control signals and data may be outputted by a control part for controlling an action of such a wireless communication apparatus etc.

Figure 3:
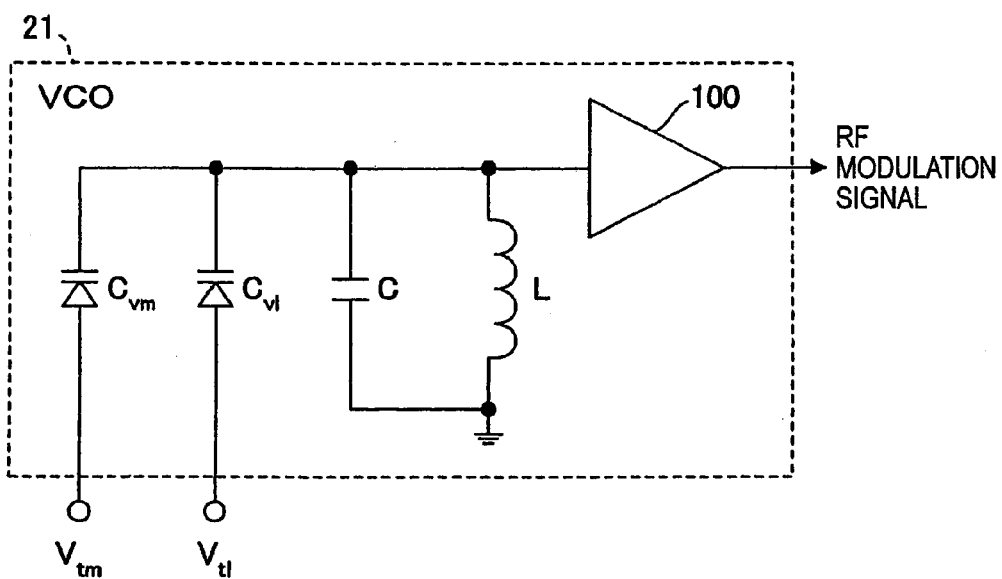
FIG. 3 is a principle diagram of a VCO of the wide band modulation PLL according to the first embodiment.

FIG. 3 is a principle diagram of a VCO of the wide band modulation PLL according to the first embodiment. It comprises an inductor L, a capacitor C, a variable capacitance diode $C_{vl}$, a variable capacitance diode $C_{vm}$ and an active element 100, and an oscillation frequency $f_{VCO}$ is determined by a mathematical formula 2.

$$f_{VCO} = \frac{1}{2\pi\sqrt{L(C + C_{vl} + C_{vm})}} \quad \text{(Mathematical formula 2)}$$

Here, in the present embodiment, a frequency of the VCO 21 is controlled by changing a capacitance value of $C_{vl}$ through control of the voltage $V_{tl}$. As a result of this, a bias potential of $V_{tm}$ can be fixed regardless of the frequency of the VCO 21, so that a modulation sensitivity of the VCO 21 by a change in $V_{tm}$ can be held substantially constant.

Figure 4:
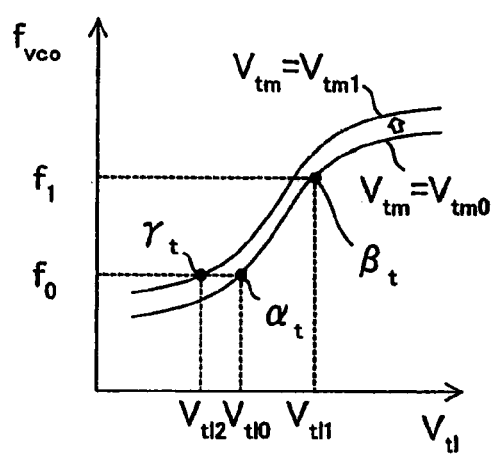
FIG. 4 is a diagram showing characteristics of oscillation frequencies versus voltages respectively applied to a control voltage terminal for PLL and a control voltage terminal for modulation of a VCO.
Figure 4:
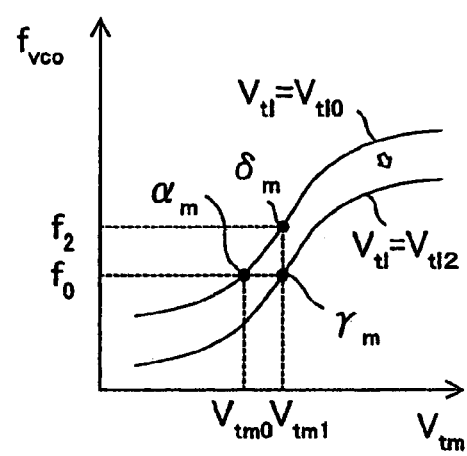

FIG. 4 is a diagram showing characteristics of oscillation frequencies versus voltages respectively applied to a control voltage terminal for PLL and a control voltage terminal for modulation of a VCO. FIG. 4(a) is a characteristic of an oscillation frequency $f_{VCO}$ of the VCO 21 versus a voltage $V_{tl}$ applied to the control voltage terminal for PLL and at this time, a control voltage $V_{tm}$ for modulation is set at a fixed value $V_{tm0}$. FIG. 4(b) is a characteristic of an oscillation frequency $f_{VCO}$ of the VCO 21 versus a voltage $V_{tm}$ applied to the control voltage terminal for modulation and at this time, a control voltage $V_{tl}$ for PLL is set at a fixed value $V_{tl0}$. When any one of the control voltages $V_{tl}$ and $V_{tm}$ is set at a fixed value, the oscillation frequency of the VCO 21 can be changed by changing the other control voltage.

Next, a method for adjusting a modulation factor in the wide band modulation PLL according to the present embodiment will be described. In the present embodiment, in the control signal generation part 28 shown in FIG. 2, a modulation sensitivity $K_m$ in the control voltage terminal for modulation of the VCO 21 is calculated and a modulation factor of modulation data is adjusted so as to compensate for an error of a gain to a modulation factor by a frequency dividing ratio based on this modulation sensitivity $K_m$.

Here, the modulation sensitivity $K_m$ in the control voltage terminal for modulation of the VCO 21 depends on a modulation sensitivity $K_l$ in the control voltage terminal for PLL, so that it is first necessary to obtain $K_l$. A method of calculation and measurement of the modulation sensitivity $K_l$ in the control voltage terminal for PLL and the modulation sensitivity $K_m$ in the control voltage terminal for modulation will be described below.

First, a control voltage $V_{tm}$ is set at a fixed value $V_{tm0}$ by the calibration data generation part 34 of the control signal generation part 28. The output signal control part 35 is in a state of measuring a modulation sensitivity, therefore, the fixed value $V_{tm0}$ of the control voltage is inputted to the VCO 21 through the D/A converter 29 as an output signal of the calibration data generation part 34.

In this state, carrier frequency data in which a frequency of the VCO 21 is locked at $f_0$ is inputted to the frequency dividing ratio generation part 26. Here, the frequency $f_0$ is a frequency of a channel which wants to be used finally. When it is assumed that a reference frequency is $f_{ref}$ and a frequency dividing ratio set in the frequency divider is $N_0$, $N_0$ is expressed by a mathematical formula 3.

$$N_0 = \frac{f_0}{f_{ref}} \quad \text{(Mathematical formula 3)}$$

When $N_0$ satisfying the mathematical formula 3 is inputted to the frequency divider 22, as a result of that, $f_{VCO}$ is locked at the frequency $f_0$ (point $\alpha_m$ in FIG. 4(b)). At this time, as shown by a point $\alpha_t$ of FIG. 4(a), a voltage applied to the control voltage terminal for PLL of the VCO 21 becomes $V_{tl}=V_{tl0}$ and this value is converted into a digital value using the A/D converter 27 and $V_{tl0}$ is stored in the measurement result storage part 30 of the control signal generation part 28.

Next, a carrier frequency in which a frequency of the VCO 21 is locked at $f_1$ is inputted to the frequency dividing ratio generation part 26 in like manner. In this case, when it is assumed that a frequency dividing ratio set in the frequency divider is $N_1$, $N_1$ is shown by a mathematical formula 4.

$$N_1 = \frac{f_1}{f_{ref}} \qquad \text{⟨Mathematical formula 4⟩}$$

When $N_1$ satisfying the mathematical formula 4 is inputted to the frequency divider 22, as a result of that, $f_{VCO}$ is locked at the frequency $f_1$. At this time, as shown by a point $\beta_t$ of FIG. 4(a), a voltage applied to the control voltage terminal for PLL of the VCO 21 becomes $V_{tl}=V_{tl1}$ and similarly, conversion into a digital value is made by the A/D converter 27 and $V_{tl1}$ is stored in the measurement result storage part 30 of the control signal generation part 28.

The operation part 31 of the control signal generation part 28 calculates a modulation sensitivity $K_l$ in the control voltage terminal for PLL based on a measured result. Here, the modulation sensitivity $K_l$ is expressed by a mathematical formula 5.

$$K_l = \frac{f_1 - f_0}{V_{tl1} - V_{tl0}} \qquad \text{⟨Mathematical formula 5⟩}$$

As described above, the modulation sensitivity $K_l$ of the control voltage terminal for PLL in the vicinity of a channel frequency $f_0$ can be obtained. This result is stored in the operation result storage part 32 of the control signal generation part 28.

Next, a calculation method of the modulation sensitivity $K_m$ in the control voltage terminal for modulation of the VCO 21 will be described. First, consider a state of locking a frequency of the VCO 21 at $f_0$ in the case that a voltage value of an input control voltage $V_{tm}$ of the control voltage terminal for modulation is set at $V_{tm}=V_{tm0}$ in a manner similar to the case of obtaining the modulation sensitivity $K_l$. A value of $V_{tl0}$ which is a control voltage of input to the control voltage terminal for PLL at this time is obtained in a calculation process of the modulation sensitivity $K_l$ and is already stored in the measurement result storage part 30.

Next, a set value of the calibration data generation part 34, that is, a value outputted from the control signal generation part 28 is changed to $V_{tm}=V_{tm1}$. Then, as shown in FIG. 4(b), in $V_t=V_{tl0}$, $f_{VCO}$ tends to change to a frequency $f_2$ (tends to move from a point $\alpha_m$ to a point $\delta_m$ in FIG. 4(b)). However, by a loop characteristic of the PLL, $V_{tl}$ changes so that $f_{VCO}$ becomes a frequency $f_0$ and as shown by an arrow, a characteristic of the control voltage $V_{tm}$ versus the frequency $f_{VCO}$ changes and is finally locked at the frequency $f_0$ (moves from the point $\delta_m$ to a point $\gamma_m$ in FIG. 4(b)).

The control voltage $V_{tl}$ of input to the control voltage terminal for PLL at this time is set at $V_{tl2}$ (a point $\gamma_t$ in FIG. 4(a)). A value in which this $V_{tl2}$ is converted into a digital value by the A/D converter 27 is stored in the measurement result storage part 30 of the control signal generation part 28. At this time, a relation shown by a mathematical formula 6 holds between the modulation sensitivity $K_m$ and the modulation sensitivity $K_l$.

$$K_m = \frac{V_{tm1} - V_{tm0}}{V_{tl0} - V_{tl2}} \times K_l \qquad \text{⟨Mathematical formula 6⟩}$$

Here, $K_l$ is already obtained and is stored in the operation result storage part 32 of the control signal generation part 28 and also $V_{tl0}$, $V_{tl2}$, $V_{tm0}$, $V_{tm1}$ are stored in the measurement result storage part 30, so that the operation part 31 obtains a modulation sensitivity $K_m$ of the control voltage terminal for modulation signal in the vicinity of a carrier frequency $f_0$ based on the mathematical formula 6 and the obtained modulation sensitivity $K_m$ is stored in the operation result storage part 32.

By the way, the mathematical formula 6 is the conversion of a mathematical formula showing a ratio between the modulation sensitivity $K_m$ and the modulation sensitivity $K_l$, so that the measured $V_{tl0}$, $V_{tl2}$, $V_{tm0}$, $V_{tm1}$ become factors showing the ratio between the modulation sensitivities $K_m$ and $K_l$. Therefore, the method for obtaining the modulation sensitivity $K_m$ is, in other words, a method for measuring and calculating the ratio between the modulation sensitivities $K_m$ and $K_l$.

Based on the modulation sensitivity $K_m$ obtained in this manner, the modulation factor adjustment unit 33 determines a gain to phase modulation data. When modulation factor adjustment is completed, the wide band modulation PLL starts a normal modulation operation and the output signal control part 35 of the control signal generation part 28 is switched so as to output an output from the modulation factor adjustment unit 33 to the D/A converter 29 by a selection control signal. A gain error of control signal modulation of the voltage controlled oscillator 21 and frequency dividing ratio modulation of the frequency divider 22 can be compensated by controlling a voltage of the VCO 21 based on the phase modulation data in which the gain is adjusted by the modulation factor adjustment unit 33.

Figure 5:
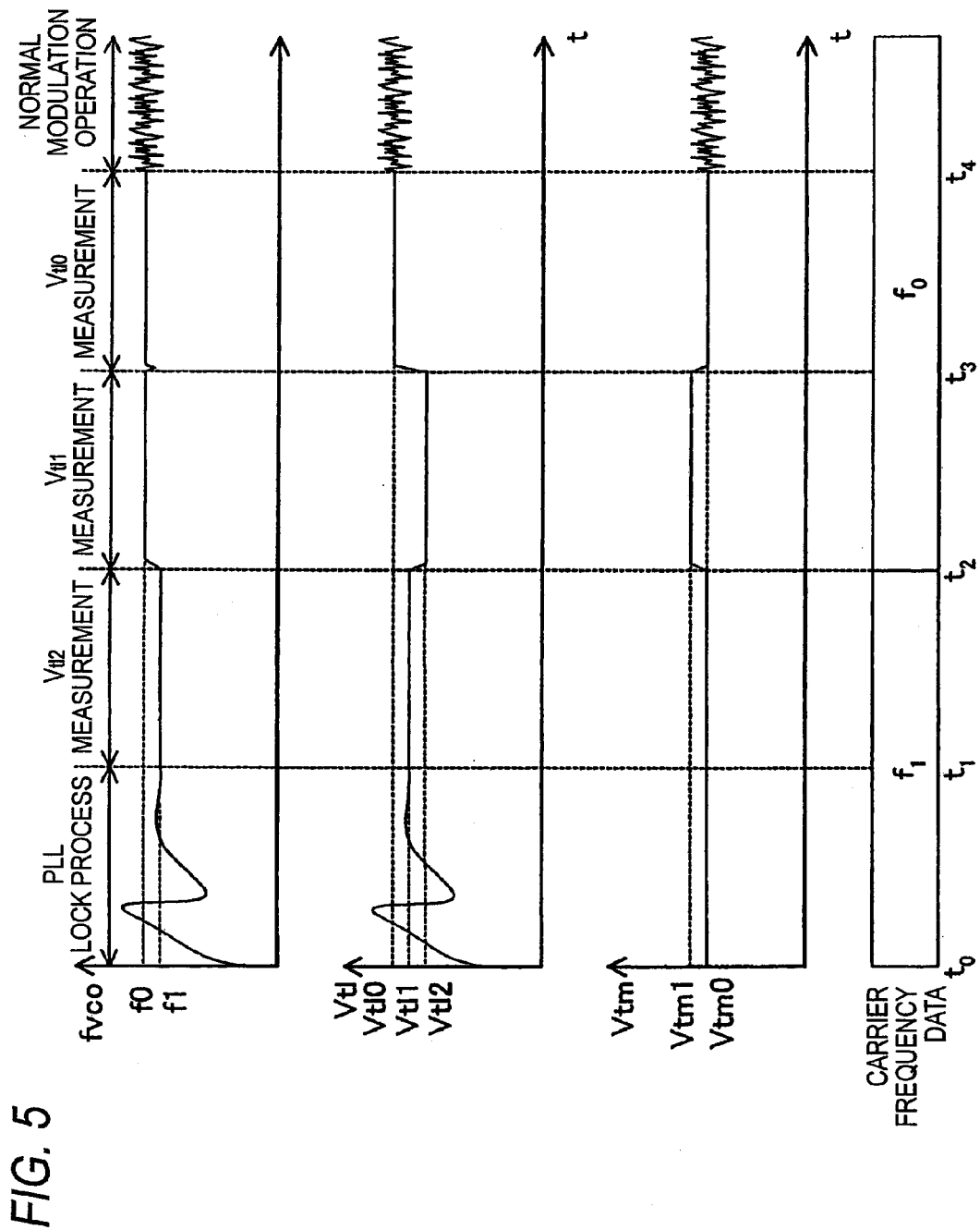
FIG. 5 is a diagram showing a timing chart of modulation factor adjustment.

Such modulation factor adjustment is made, for example, every time the wide band modulation PLL is started and every time a carrier frequency used is changed (hereinafter called initial correction). A procedure at the time of this initial correction will be described below with reference to FIG. 5. FIG. 5 is a diagram showing a timing chart of modulation factor adjustment. Here, description will be made using the case of performing modulation at a center frequency $f_0$ and $V_{tm}=V_{tm0}$ as an example.

First, at time $t_0$, carrier frequency data of a frequency $f_1$ is inputted. At this time, the calibration data generation part 34 sets $V_{tm}$ at $V_{tm0}$. The PLL converges to the frequency $f_1$ by time $t_1$ and the measurement result storage part 30 measures and stores $V_{tl1}$ between $t_1$ and $t_2$.

Next, at time $t_2$, the carrier frequency data is set at a frequency $f_0$ and the calibration data generation part 34 sets $V_{tm}$ at $V_{tm1}$. In this state, the measurement result storage part 30 measures and stores $V_{tl2}$. Finally, at time $t_3$, the calibration data generation part 34 sets $V_{tm}$ at $V_{tm0}$ and thereby the frequency $f_0$ does not vary by a loop characteristic of the PLL, but $V_{tl}$ varies from $V_{tl2}$ to $V_{tl0}$. In this state, the measurement result storage part 30 measures and stores $V_{tl0}$ and the operation part 31 calculates a modulation sensitivity $K_m$ based on the mathematical formula 5 and the mathematical formula 6. In this manner, by the modulation factor adjustment unit 33, a gain is set at a proper value and a normal modulation operation is started from time $t_4$.

Incidentally, as described above, by using $V_{tl1}$, $V_{tl2}$, $V_{tl0}$ as a concrete example of order of measuring an input voltage $V_t$ to the control voltage terminal for PLL of the VCO 21, at the time of starting the normal modulation operation, setting is already made at the carrier frequency $f_0$ and control voltage $V_{tm0}$, so that the wide band modulation PLL can speedily shift to the normal modulation operation. However, measurement of this voltage $V_t$ can be achieved in any order.

Next, a method of correction to variations in environment after initial correction, that is, after starting the normal modulation operation will be described. At the time of the completion or after the completion of initial correction, the peak value of vibration amplitude of $V_{tl}$ in the control voltage terminal for PLL of the VCO 21 is stored in the measurement result storage part 30 through the A/D converter 27. At this time, a value of $V_{tm}$ (DC value) is associated as $V_{tm0}$. Then, in like manner subsequently, the vibration amplitudes are monitored at proper time intervals. Here, the proper time intervals refer to the extent to which variations in temperature or power source voltage can be monitored. When this peak value varies, a modulation sensitivity $K_l$ in the PLL control voltage terminal changes by the varying proportion and an absolute value of the modulation sensitivity $K_l$ changing from the modulation sensitivity $K_l$ obtained by the initial correction is obtained.

On the other hand, still at proper time intervals, $V_{tm}$ is slightly changed from $V_{tm0}$ to $V_{tm0}'$. At this time, $V_{tl}$ slightly changes in a manner similar to the initial correction. This change amount is stored and a value of $V_{tm}$ is again changed to $V_{tm0}$. From the modulation sensitivity $K_l$ and the proportion of this change amount of $V_{tl}$, a modulation sensitivity $K_m$ of the side of the control voltage terminal for modulation is obtained in a manner similar to the initial correction. Modulation accuracy which is always good and stable with respect to environmental variations caused by temperature variations or power source voltage variations, etc. by adjusting a modulation factor based on this modulation sensitivity $K_m$ can be provided.

According to the wide band modulation PLL of such a first embodiment, the need for a lookup table every each channel is eliminated, so that a wide band modulation PLL with small size, low cost and low power consumption can be provided. Further, it can respond to variations in environment at the time of actual use, for example, a normal modulation operation or every initial operation, so that a wide band modulation PLL for achieving modulation accuracy which is always good and stable can be provided.

SECOND EMBODIMENT

Figure 6:
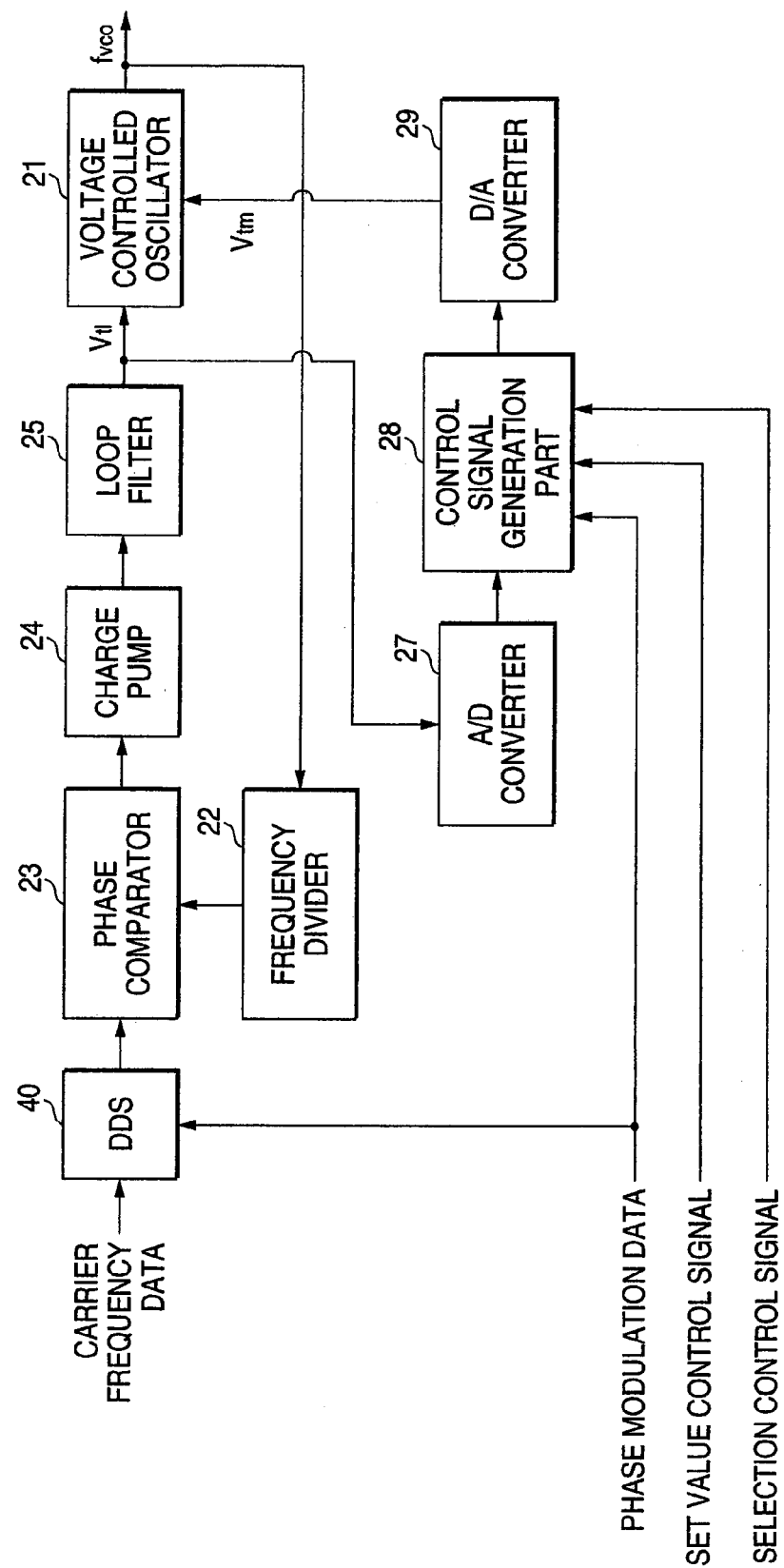
FIG. 6 is a schematic configuration diagram showing a wide band modulation PLL for describing a second embodiment of the present invention.

FIG. 6 is a schematic configuration diagram showing a wide band modulation PLL for describing a second embodiment of the present invention. The same numerals are attached to portions overlapping with FIG. 1 described in the first embodiment.

In FIG. 6, the wide band modulation PLL according to the second embodiment includes a direct digital synthesizer (hereinafter DDS) 40 and differs from that of the first embodiment in that a point at which phase modulation is performed is two points of the DDS 40 and a VCO 21.

The DDS 40 is adapted for directly outputting a result of numerical operation through a built-in D/A converter etc. and as shown in FIG. 6, based on carrier frequency data and phase modulation data, numerical calculation can be performed to output a carrier signal and a modulation signal. Since modulation in the DDS 40 is similar to frequency dividing ratio modulation of the first embodiment, modulation factor adjustment and calculation of a modulation sensitivity of a control voltage terminal for modulation signal can be obtained by a similar method.

However, in an output of the DDS 40, a waveform is directly generated by numerical operation, so that a fixed frequency divider with fixing of a frequency dividing ratio can be applied as a frequency divider 2 disposed in the wide band modulation PLL. The fixed frequency divider can be constructed by connecting plural frequency dividers in longitudinal sequence and an operating frequency decreases with a back stage further, so that power consumption can be reduced.

According to such a second embodiment of the present invention, modulation accuracy which is always good and stable with respect to environmental variations caused by temperature variations or power source voltage variations, etc. can be provided. Also, the need for a lookup table every each channel is eliminated, so that a wide band modulation PLL system with small size, low cost and low power consumption can be provided. Further, a fixed frequency divider can be applied as a frequency divider, so that power consumption can be reduced.

THIRD EMBODIMENT

Figure 7:
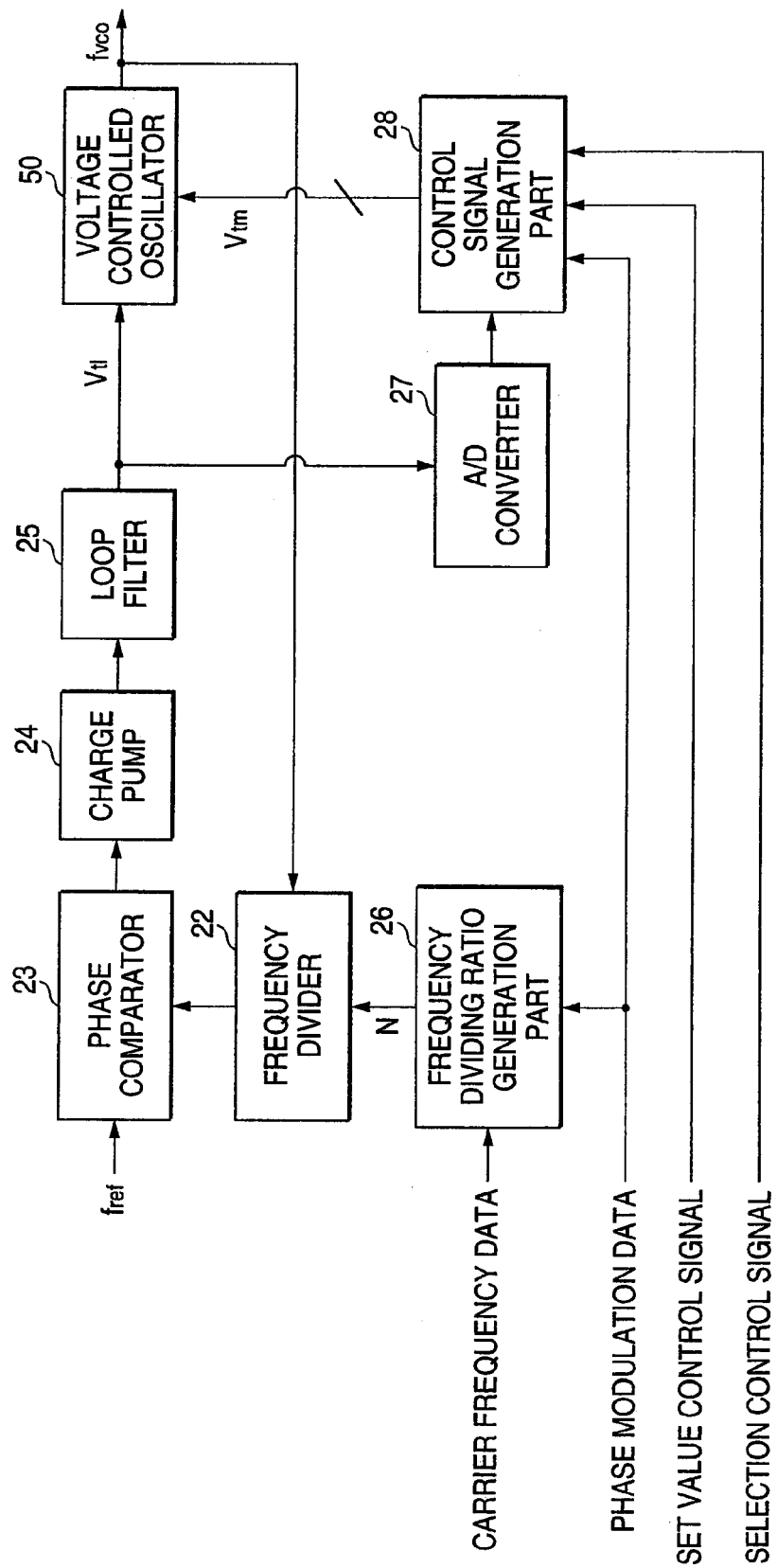
FIG. 7 is a schematic configuration diagram showing a wide band modulation PLL for describing a third embodiment of the present invention.

FIG. 7 is a schematic configuration diagram showing a wide band modulation PLL for describing a third embodiment of the present invention. The same numerals are attached to portions overlapping with FIG. 1 described in the first embodiment.

In the present embodiment, a signal outputted from a control signal generation part 28 is inputted to a VCO 50 in a state of a digital signal without making D/A conversion. The VCO 50 has a switch and small capacitance in parallel with an LC resonator, and performs an action similar to that of the VCO 21 shown in FIG. 3 by changing the total capacitance value by controlling this switch through the digital signal. A method of adjustment and measurement of a modulation sensitivity is similar to that of the first embodiment.

Figure 8:
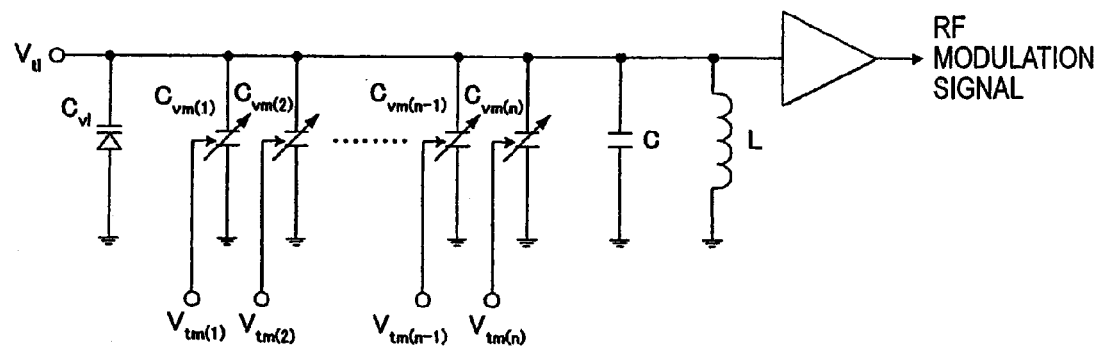
FIG. 8 is a principle diagram showing one example of a VCO used in the wide band modulation PLL according to the third embodiment.

FIG. 8 is a principle diagram showing one example of a VCO used in the wide band modulation PLL according to the third embodiment. As shown in FIG. 8, in the VCO 50, n $C_{vm(1)}$ to $C_{vm(n)}$ in which capacitance is variable in binary by an input digital signal are connected in parallel and by switching each of the capacitances, modulation can be performed by the sum of these capacitances. By this configuration, the VCO 50 can be controlled to perform modulation using digital outputs $V_{tm}$ of the control signal generation part 28.

According to such a third embodiment of the present invention, modulation accuracy which is always good and stable with respect to environmental variations caused by temperature variations or power source voltage variations, etc. can be provided. Also, the need for a lookup table every each channel or a D/A converter is eliminated, so that a wide band modulation PLL system with small size, low cost and low power consumption can be provided.

FOURTH EMBODIMENT

Figure 9:
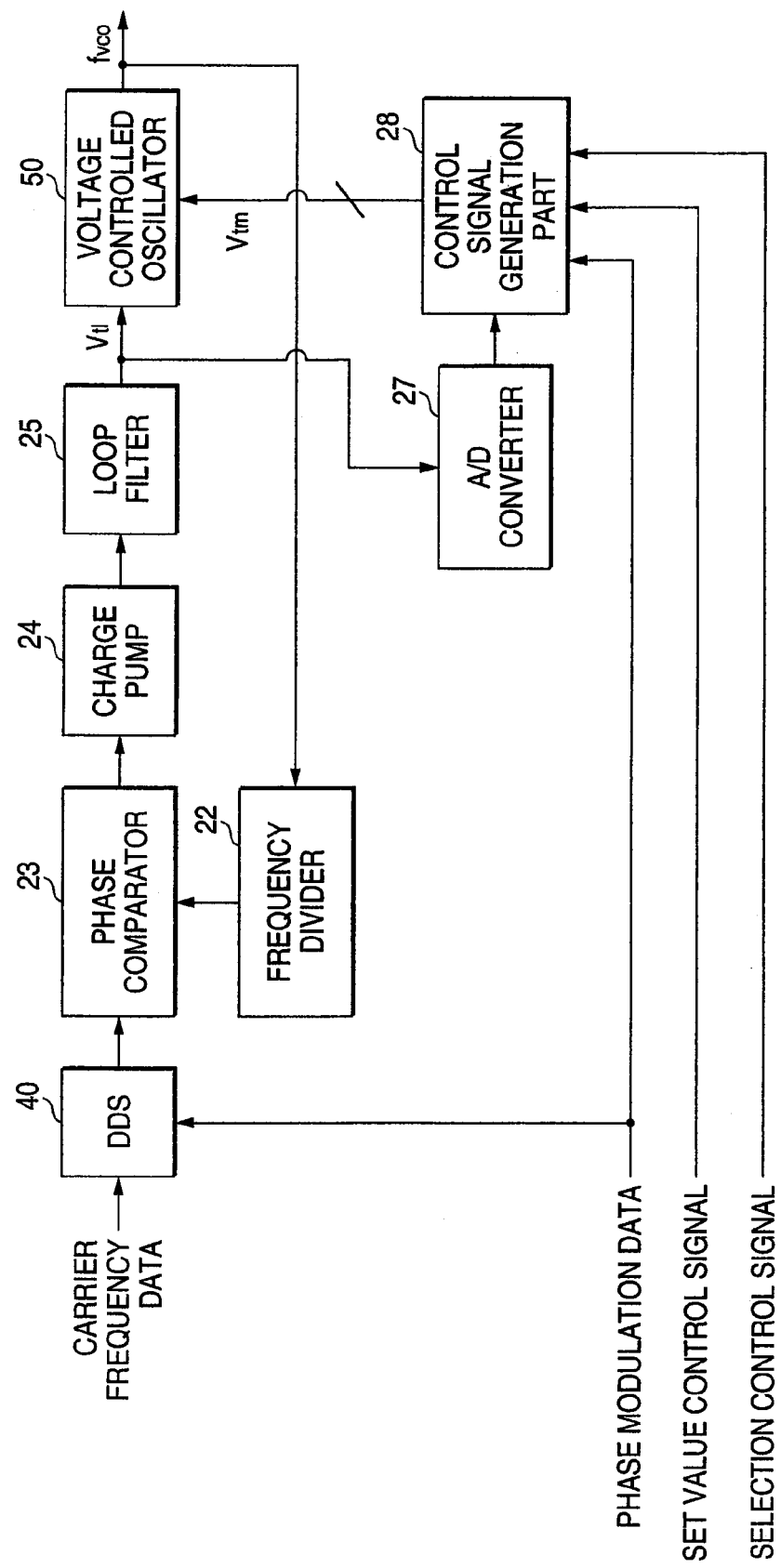
FIG. 9 is a wide band modulation PLL for describing a fourth embodiment of the present invention.
Figure 10:
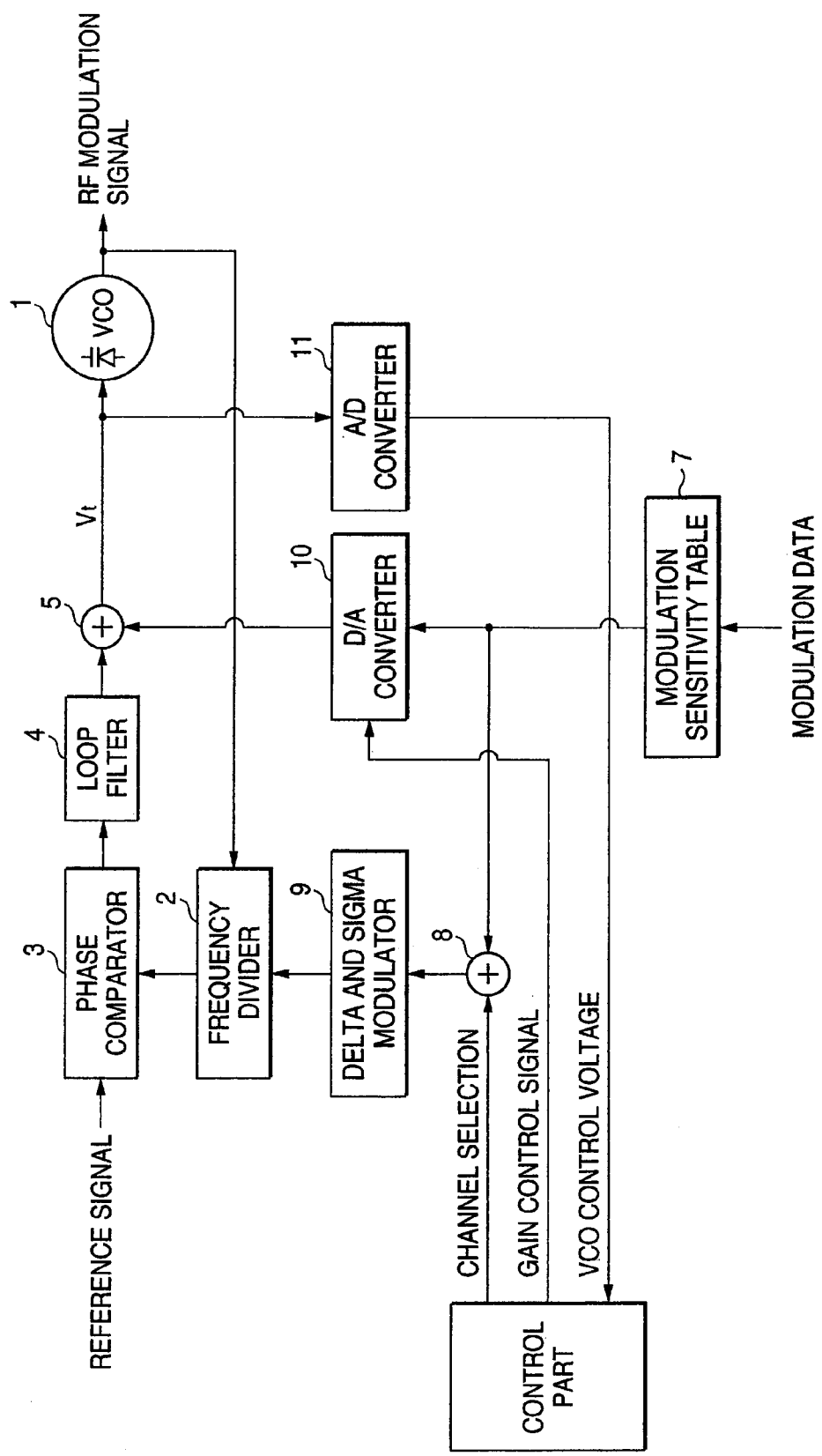
FIG. 10 is a schematic configuration diagram showing a conventional wide band modulation PLL.
Figure 11:
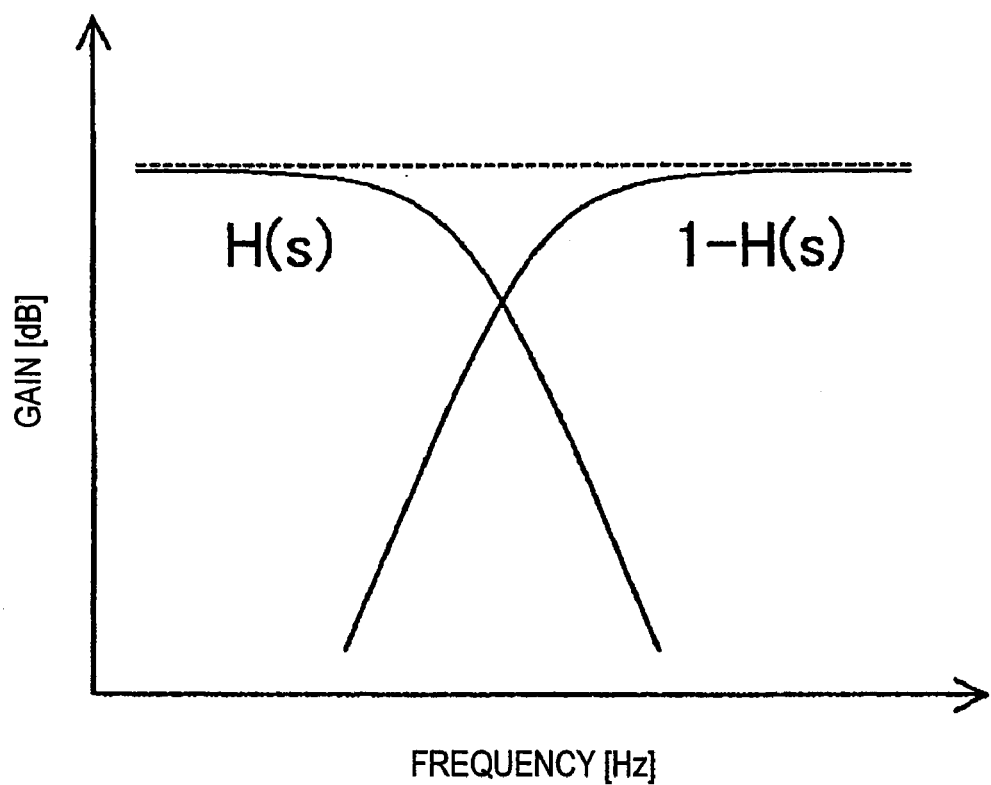
FIG. 11 is a diagram showing a frequency characteristic for description of an action of a wide band modulation PLL.
Figure 12:
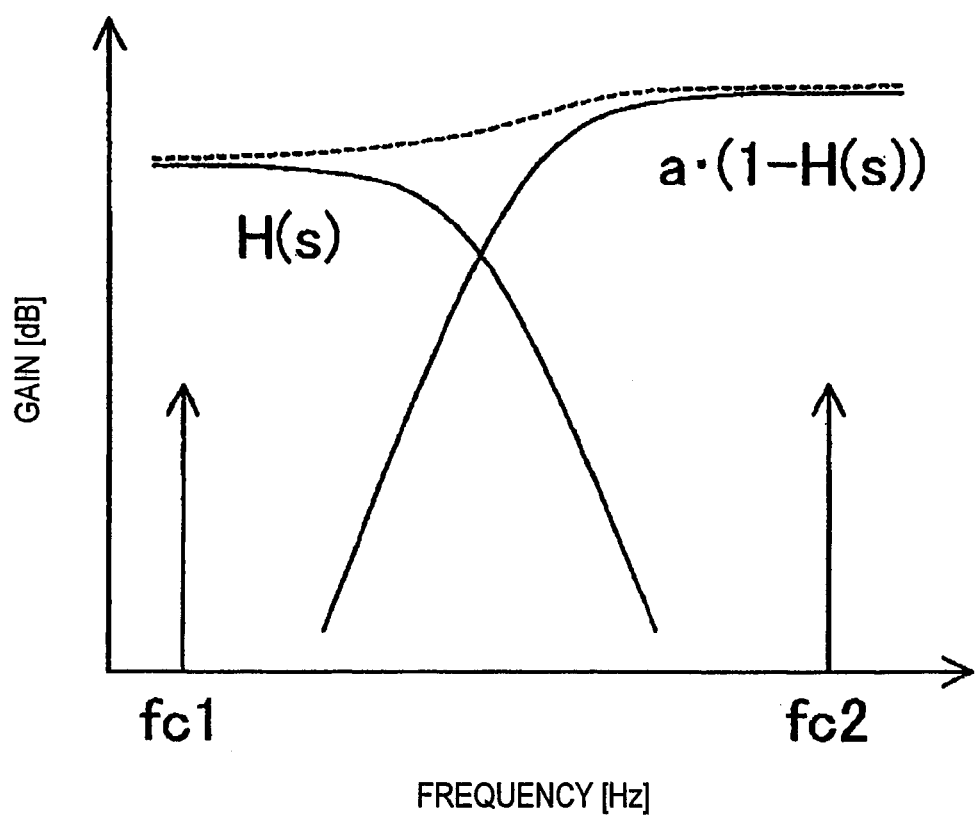
FIG. 12 is a diagram showing a frequency characteristic for description of an action of the wide band modulation PLL.
Figure 13:
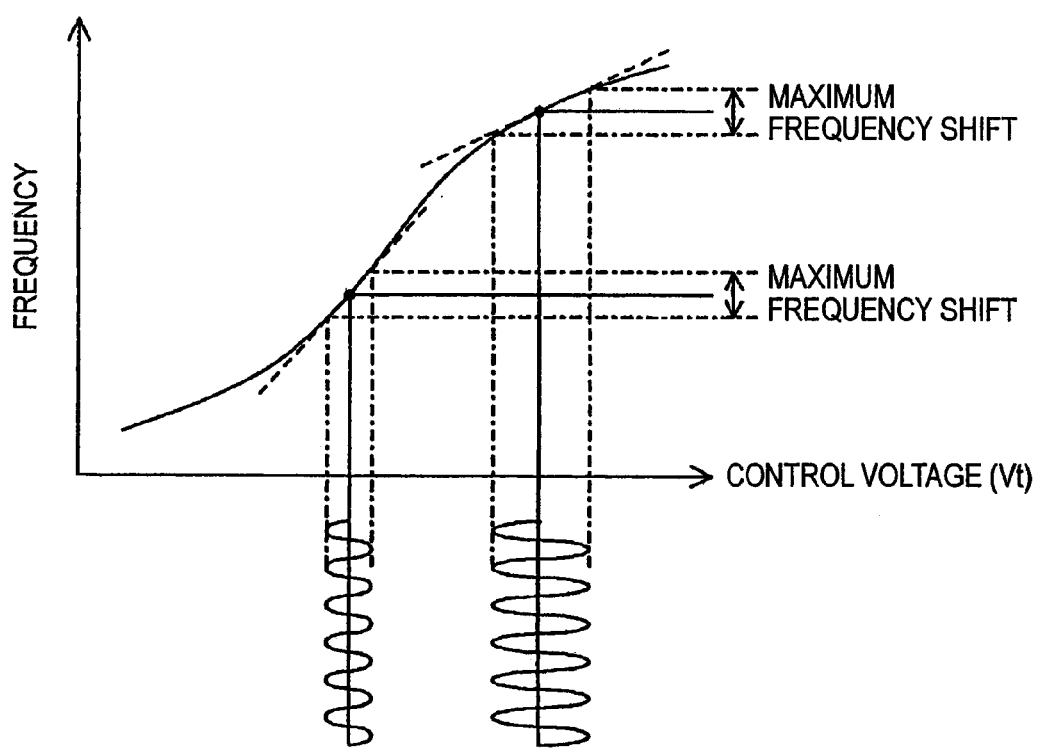
FIG. 13 is a diagram showing one example of a characteristic representing a change in an output signal frequency versus a control voltage of a general VCO.
Figure 14:
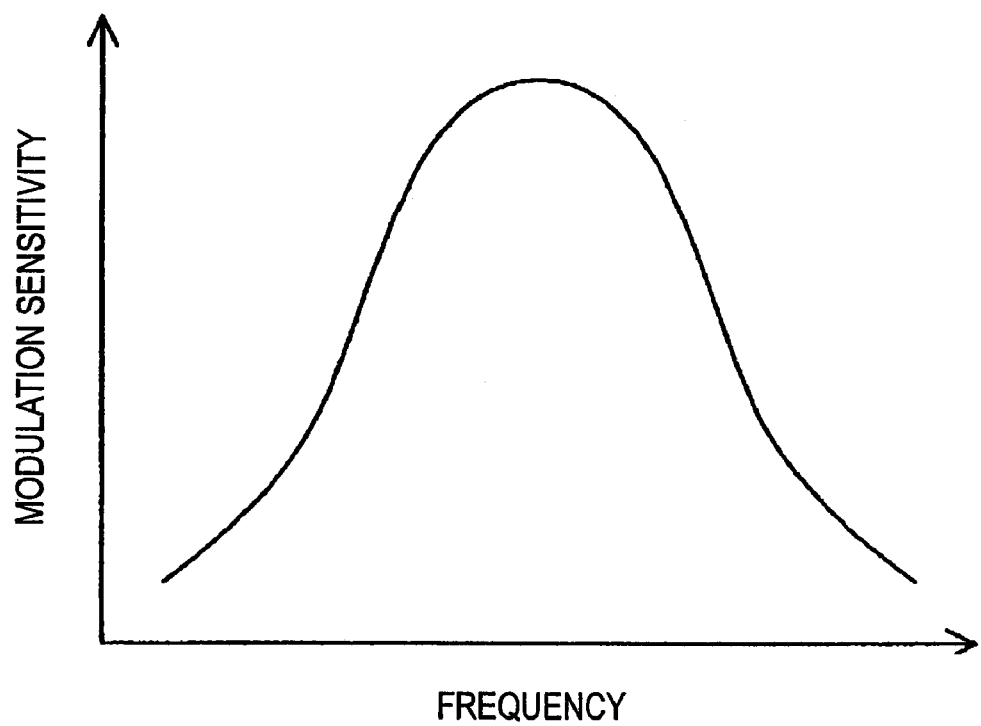
FIG. 14 is a diagram showing a characteristic of a modulation sensitivity versus an oscillation frequency of a general VCO.
Figure 15:
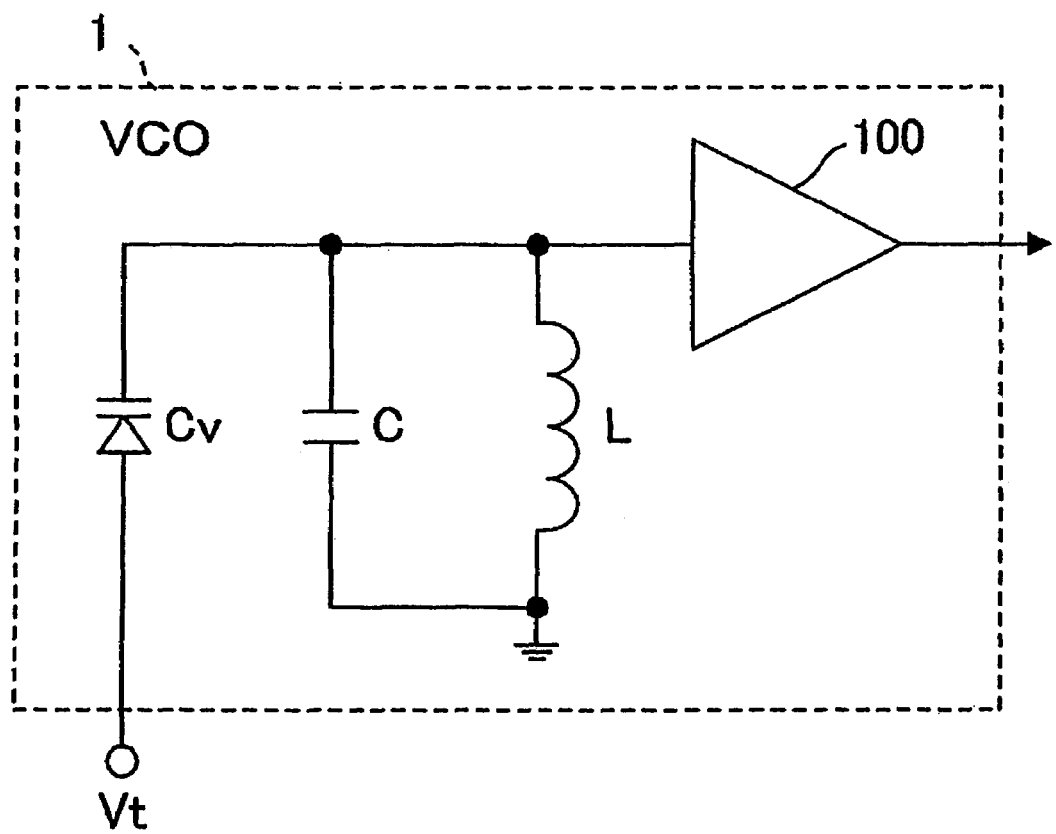
FIG. 15 is one example of a principle diagram of a VCO.

FIG. 9 is a schematic configuration diagram showing a wide band modulation PLL for describing a fourth embodiment of the present invention. The same numerals are attached to portions overlapping with FIGS. 1, 6 and 7 described in the first, second and third embodiments.

As shown in FIG. 9, in the wide band modulation PLL of the present embodiment, modulation is performed at points of a DDS 40 and a VCO 50 and a digital signal is applied to a modulation signal inputted from a control signal generation part 28 to a modulation side control terminal of the VCO 50. A method of correction and measurement of a modulation sensitivity is similar to that of the first embodiment, and an action of the DDS 40 is similar to that of the second embodiment, and an action of the VCO 50 is similar to that of the third embodiment.

According to such a fourth embodiment of the present invention, modulation accuracy which is always good and stable with respect to environmental variations caused by temperature variations or power source voltage variations, etc. can be provided. Also, the need for a lookup table every each channel or a D/A converter is eliminated, so that a wide band modulation PLL system with small size, low cost and low power consumption can be provided. Further, a fixed frequency divider can be applied as a frequency divider, so that power consumption can be reduced.

The description has been made above with reference to the first to fourth embodiments, but the present invention is not limited to these configurations. For example, setting of a frequency dividing ratio has been made with respect to a variable frequency divider inside a loop, but a configuration in which a variable frequency divider for dividing a frequency of a reference signal and outputting the signal to a phase comparator is disposed and setting of a frequency dividing ratio is made by the variable frequency divider can be achieved similarly. Also, an A/D converter or a D/A converter can similarly be achieved in places other than the places used in the description, and the boundary between analog and digital may be present in any places. Also, a D/A converter in which a low-pass filter is included in the output side can be achieved similarly.

The present invention has been described in detail with reference to the particular embodiments, but it is apparent to those skilled in the art that various changes or modifications can be made without departing from the spirit and scope of the present invention.

The present application is based on Japanese Patent application No. 2003-298858 filed on Aug. 22, 2003, the contents of which are hereby incorporated by reference.

INDUSTRIAL APPLICABILITY

A wide band modulation PLL of the present invention has an effect capable of achieving good modulation accuracy at low cost, and is useful for a wireless communication apparatus etc. of a wireless base station apparatus etc. or a mobile wireless device.

The invention claimed is:

1. A wide band modulation PLL, comprising:
   a PLL part, including:
      a voltage controlled oscillator;
      a frequency divider that divides a frequency of an output signal of the voltage controlled oscillator;
      a phase comparator that outputs a signal based on a phase difference between a reference signal and the output signal of the frequency divider; and
      a loop filter that outputs an output to the voltage controlled oscillator so as to average the output of the phase comparator;
   a first modulation input part that inputs a first modulation signal to the voltage controlled oscillator based on inputted modulation data for modulating; and
   a second modulation input part that inputs a second modulation signal to a position different from the voltage controlled oscillator in the PLL part based on the modulation data,
   wherein the voltage controlled oscillator includes a first control terminal to which the first modulation signal is inputted and a second control terminal to which a signal based on the second modulation signal is inputted; and
   wherein the first modulation input part has a modulation sensitivity calculation unit that calculates a first modulation sensitivity in the first control terminal and a modulation factor adjustment unit that adjusts a modulation factor of the modulation data based on the calculated first modulation sensitivity and outputs the first modulation signal.

2. The wide band modulation PLL as set forth in claim 1, wherein the modulation sensitivity calculation unit has a modulation sensitivity calculation part that measures a signal inputted to the second control terminal, that calculates a second modulation sensitivity in the second control terminal, that measures a value indicating a ratio between the second modulation sensitivity and the first modulation sensitivity, and that calculates the first modulation sensitivity based on the calculated second modulation sensitivity.

3. The wide band modulation PLL as set forth in claim 1, wherein the first modulation input part has an A/D converter that makes digital conversion of a signal inputted to the second control terminal of the voltage controlled oscillator, the modulation sensitivity calculation unit, the modulation factor adjustment unit, and a D/A converter that makes analog conversion of an output of the modulation factor adjustment unit and that outputs the output to the first control terminal.

4. The wide band modulation PLL as set forth in claim 1, wherein the first modulation input part includes an A/D converter that makes digital conversion of a signal inputted to the second control terminal of the voltage controlled oscillator, the modulation sensitivity calculation unit, and the modulation factor adjustment unit;
   wherein the modulation factor adjustment unit outputs a digital signal to the first control terminal; and
   wherein the voltage controlled oscillator changes a frequency based on the digital signal inputted to the first control terminal.

5. The wide band modulation PLL as set forth in any claim 1, wherein the second modulation input part has a frequency dividing ratio generation unit that controls a frequency dividing ratio of the frequency divider based on carrier frequency data and the modulation data.

6. The wide band modulation PLL as set forth in claim 1, wherein the second modulation input part has a direct digital synthesizer that generates a modulation signal based on carrier frequency data and the modulation data and that outputs the modulation signal to the phase comparator.

7. The wide band modulation PLL as set forth in claim 1, wherein the first modulation input part calculates the first modulation sensitivity, adjusts a modulation factor and outputs the first modulation signal at the time of an activation of the wide band modulation PLL and every predetermined period is elapsed after the activation.

8. The wireless terminal apparatus incorporating the wide band modulation PLL according to any one of claims 1 through 7.

9. A modulation factor adjustment method of a wide band modulation PLL comprising a PLL part including a voltage controlled oscillator, a frequency divider for dividing a frequency of an output signal of the voltage controlled oscillator, a phase comparator for outputting a signal according to a phase difference between a reference signal and an output signal of the frequency divider, and a loop filter for averaging an output of the phase comparator and outputting the output to the voltage controlled oscillator, the method comprising:
   inputting a first modulation signal to a first control terminal of the voltage controlled oscillator for modulating;

inputting a second modulation signal to a position different from the voltage controlled oscillator in the PLL part based on the PLL by inputting carrier frequency data;

calculating a first modulation sensitivity in the first control terminal of the voltage controlled oscillator, and adjusting a modulation factor of the first modulation signal based on the calculated first modulation sensitivity, wherein the step of calculating the first modulation sensitivity comprises the steps of:

measuring an input voltage inputted to a second control terminal being different from the first control terminal in the voltage controlled oscillator based on the second modulation signal;

calculating a second modulation sensitivity in the second control terminal; and measuring a value indicating a ratio between the second modulation sensitivity and the first modulation sensitivity, and calculating the first modulation sensitivity based on the calculated second modulation sensitivity.

10. A modulation factor adjustment method of a wide band modulation PLL comprising a PLL part including a voltage controlled oscillator, a frequency divider for dividing a frequency of an output signal of the voltage controlled oscillator, a phase comparator for outputting a signal according to a phase difference between a reference signal and an output signal of the frequency divider, and a loop filter for averaging an output of the phase comparator and outputting the output to the voltage controlled oscillator, the method comprising:

inputting a first modulation signal to a first control terminal of the voltage controlled oscillator for modulating;

inputting a second modulation signal to a position different from the voltage controlled oscillator in the PLL part based on the PLL by inputting carrier frequency data and inputting a signal based on the second modulation signal to a second control terminal of the voltage controlled oscillator;

calculating a first modulation sensitivity in the first control terminal of the voltage controlled oscillator, and adjusting a modulation factor of the first modulation signal based on the calculated first modulation sensitivity.

* * * * *